(12) United States Patent
Tanaka et al.

(10) Patent No.: US 10,854,428 B2
(45) Date of Patent: Dec. 1, 2020

(54) SPATIAL ATOMIC LAYER DEPOSITION CHAMBER WITH PLASMA PULSING TO PREVENT CHARGE DAMAGE

(71) Applicant: Applied Materials, Inc., Santa Clara, CA (US)

(72) Inventors: Tsutomu Tanaka, Santa Clara, CA (US); Dmitry A. Dzilno, Sunnyvale, CA (US); Alexander V. Garachtchenko, Mountain View, CA (US); Keiichi Tanaka, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/217,978

(22) Filed: Dec. 12, 2018

(65) Prior Publication Data
US 2019/0180985 A1    Jun. 13, 2019

Related U.S. Application Data

(60) Provisional application No. 62/598,447, filed on Dec. 13, 2017.

(51) Int. Cl.
| | | |
|---|---|---|
| *H01L 21/00* | (2006.01) | |
| *H01J 37/32* | (2006.01) | |
| *H01L 21/02* | (2006.01) | |
| *H01L 21/285* | (2006.01) | |
| *H01L 21/687* | (2006.01) | |
| *C23C 16/455* | (2006.01) | |
| *C23C 16/505* | (2006.01) | |

(52) U.S. Cl.
CPC .. *H01J 37/32174* (2013.01); *C23C 16/45525* (2013.01); *C23C 16/505* (2013.01); *H01J 37/32449* (2013.01); *H01J 37/32715* (2013.01); *H01J 37/32743* (2013.01); *H01J 37/32752* (2013.01); *H01J 37/32788* (2013.01); *H01J 37/32899* (2013.01); *H01L 21/0228* (2013.01); *H01L 21/0262* (2013.01); *H01L 21/02274* (2013.01); *H01L 21/28556* (2013.01); *H01L 21/68764* (2013.01); *H01L 21/68771* (2013.01); *H01J 2237/20214* (2013.01); *H01J 2237/20285* (2013.01); *H01J 2237/332* (2013.01)

(58) Field of Classification Search
None
See application file for complete search history.

(56) References Cited

U.S. PATENT DOCUMENTS

| | | |
|---|---|---|
| 8,389,419 B2 | 3/2013 | Shanker et al. |
| 2009/0047795 A1 | 2/2009 | Matsudo et al. |
| 2014/0062304 A1 | 3/2014 | Nakano et al. |
| 2014/0113457 A1 | 4/2014 | Sims et al. |
| 2015/0200110 A1 | 7/2015 | Li et al. |

OTHER PUBLICATIONS

PCT International Search Report and Written Opinion in PCT/US2018/065211 dated May 10, 2019, 13 pages.

*Primary Examiner* — Reema Patel
(74) *Attorney, Agent, or Firm* — Servilla Whitney LLC (57) ABSTRACT

Apparatus and methods of processing a substrate in a plasma enhanced spatial atomic layer deposition chamber. A substrate is moved through one or more plasma processing regions and one or more non-plasma processing regions while the plasma power is pulsed to prevent a voltage differential on the substrate from exceeding a breakdown voltage of the substrate or device being formed on the substrate.

17 Claims, 3 Drawing Sheets

SPATIAL ATOMIC LAYER DEPOSITION CHAMBER WITH PLASMA PULSING TO PREVENT CHARGE DAMAGE

CROSS-REFERENCE TO RELATED APPLICATIONS

This application claims priority to U.S. Provisional Application No. 62/598,447, filed Dec. 13, 2017, the entire disclosure of which is hereby incorporated by reference herein.

TECHNICAL FIELD

The present disclosure relates generally to apparatus and methods to deposit thin films. In particular, the disclosure relates to apparatus and methods to deposit thin film using plasma-enhanced spatial atomic layer deposition with pulsed radio frequency (RF) plasma to prevent charge damage.

BACKGROUND

Semiconductor devices are damages during spatial plasma enhanced atomic layer deposition (PEALD) processes due to charge build-up caused by non-uniform plasma exposure. In a spatial PEALD process, one or more semiconductor wafers are moved amongst various processing region of a processing chamber. Some of the processing regions will contain plasma with energetic species while other regions are purely chemical zones (i.e., no plasma activation).

Because of the throughput and real estate concerns, plasma is continuously present in the plasma zones, while the wafers travel in and out of the plasma zones. This creates a condition where only a part of the wafer is covered with the plasma, inducing a non-uniform potential across the wafer. This electrical potential non-uniformity causes a charge build-up that can damage the device under process.

The RF power could be reduced so that a potential gradient that exceeds the breakdown voltage is not generated. However, this approach slows down the process speed, reducing the overall throughput of the processing tool.

Another approach is to increase the size of the plasma area to cover the whole wafer under the plasma. A stop-and-go processing approach would be used instead of a continuous wafer motion to ensure that the wafer is fully within the plasma region before plasma processing. This would increase the footprint of the processing chamber and/or decrease the throughput of the process chamber.

Therefore, there is a need in the art for apparatus and methods for spatial PEALD that reduces or eliminates the charge build-up on the wafer.

SUMMARY

One or more embodiments of the disclosure are directed to processing methods comprising positioning a substrate within a batch processing chamber. The batch processing chamber comprises a plurality of process regions separated by gas curtains. The substrate has a breakdown voltage. The substrate is moved from a first processing region without a plasma to a second processing region with a plasma. A power of the plasma in the second processing region is pulsed to prevent a voltage differential on the substrate from exceeding the breakdown voltage.

Additional embodiments of the disclosure are directed to processing chambers comprising a susceptor assembly, a gas distribution assembly and a controller. The susceptor assembly supports a plurality of substrates and rotates the plurality of substrate about a central axis of the susceptor assembly. The susceptor assembly has a top surface with a plurality of recesses sized to hold the substrates. The gas distribution assembly has a front surface spaced from the top surface of the susceptor assembly to form a gap. The gas distribution assembly includes a plurality of gas ports and vacuum ports to provide a plurality of gas flows into the gap and a plurality of vacuum flows to remove gases from the gap. The plurality of gas ports and vacuum ports are arranged to form a plurality of process regions, each process region separated from adjacent process regions by a gas curtain. At least one of the processing regions is a plasma processing region and at least one of the processing regions is a non-plasma processing region. The controller is coupled to the susceptor assembly and the gas distribution assembly. The controller has one or more configurations selected from a first configuration to rotate the susceptor assembly about the central axis, a second configuration to provide a flow of gas into the non-plasma processing region, a third configuration to provide a flow of gas into the plasma processing region, a fourth configuration to provide power to the plasma processing region to ignite a plasma and/or a fifth configuration to pulse the power to the plasma processing region to generate an ON time and an OFF time for the plasma processing region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

One or more embodiments of the disclosure advantageously reduces the charge build up on a substrate during spatial PEALD processing. Some embodiments advantageously provide methods that reduce damage to capacitors formed as part of transistors. One or more embodiments of the disclosure reduces the charge build-up on a substrate by pulsing the RF power for the plasma source.

In some embodiments, the substrate has one or more transistors formed or being formed thereon. The transistor gates on the substrate which are damaged by the charge build-up include capacitors and the plasma sheath has a finite resistance, it takes some time to charge up these devices. The time to charge the devices is on the order of the RC time constant. The inventors have found that if the RF pulse is short enough, the charge will not reach a level to cause voltage breakdown. The RF pulsing allows the charge to dissipate during off periods.

In a spatial PEALD processing chamber, the wafer travel through a plasma region that is smaller than the size (i.e., diameter) of the wafer. Due to the inherently non-uniform plasma condition (wafer goes from no plasma to 100% of peak plasma density) the wafer surface experiences non-uniform floating potential. The floating potential difference between two points on the wafer will result in charging of the device (e.g., transistors on the substrate). If the voltage across the gate dielectrics reaches above the breakdown voltage, damage to the device will occur. Because the gate of each transistor on the wafer is a capacitor, and since the plasma has a finite sheath resistance, it takes a finite time to charge up the device. The finite time to charge up the device is determined by the RC time constant.

Without being bound by any particular theory of operation, it is believed that some embodiments of the disclosure decrease the time that the wafer, or the device being formed, is exposed to the high floating potential gradient. The inventors have found that decreasing the plasma exposure time by cycling the RF power can lower the potential gradient to a level that does not exceed the breakdown voltage across the gate. The plasma exposure time can be followed by another period during which the plasma does not have a large voltage gradient and does not continue to increase the accumulated charge on the device and allowing the charge to discharge. If the device discharges completely during this period, repeating the cycle will not cumulatively increase the voltage across the gate and damage will not occur. In some embodiments, pulsing the RF power—turning the RF power on and off repeatedly—allows the device to charge/discharge without causing damage. The ON/OFF time can be on the order of microseconds to tens of microseconds. If the plasma fluctuates during the first few microseconds of the ON period, the transient behavior of the plasma may dictate the amount of charge (or the voltage) that the gate will experience, rather than the RC time constant.

Figure 1:
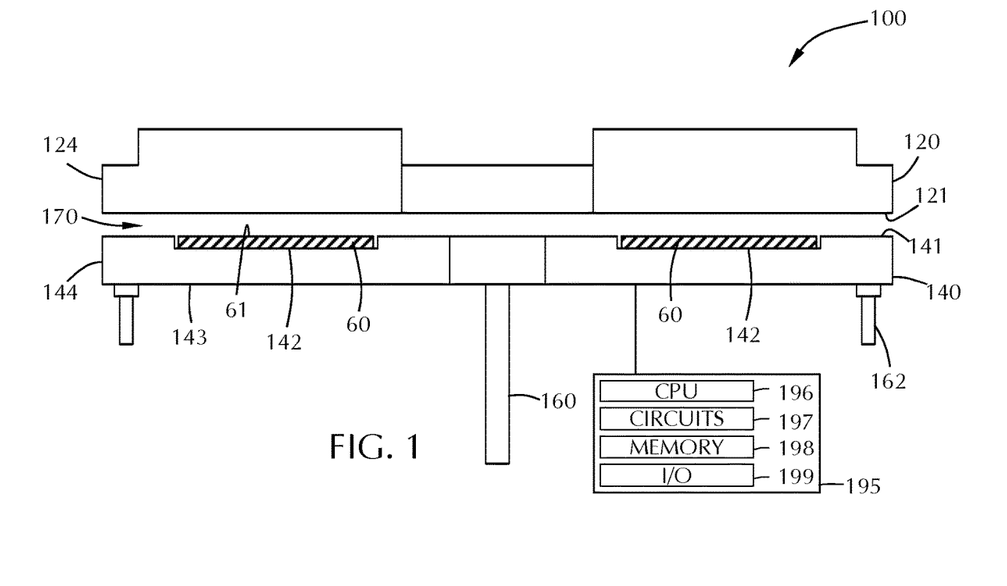
FIG. 1 shows a cross-sectional view of a batch processing chamber in accordance with one or more embodiment of the disclosure.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
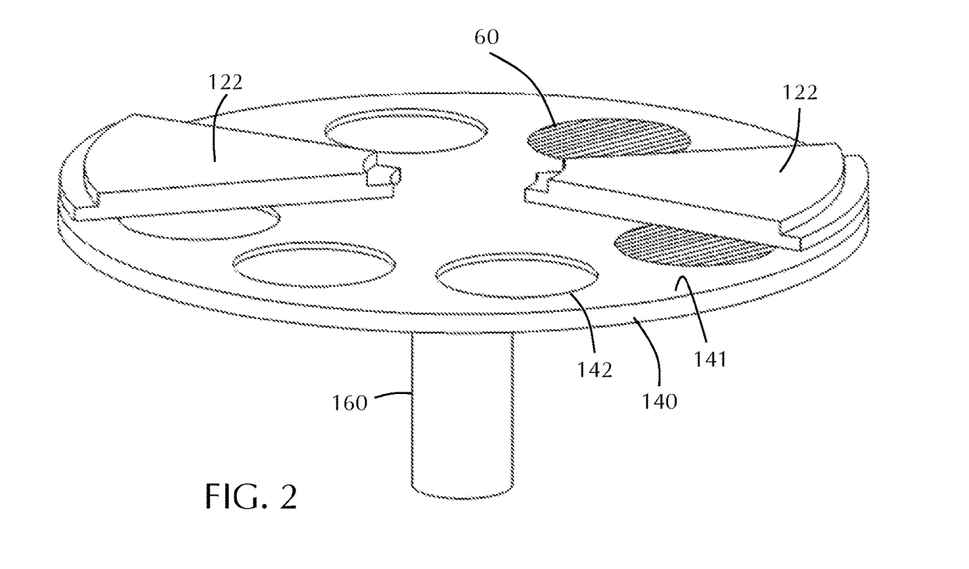
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
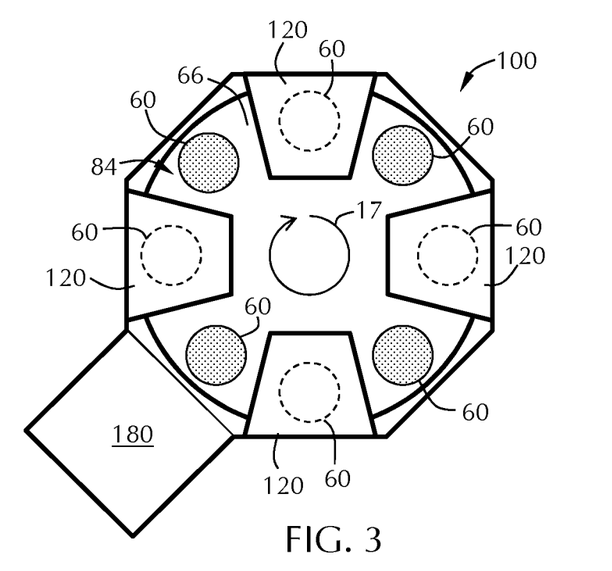
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
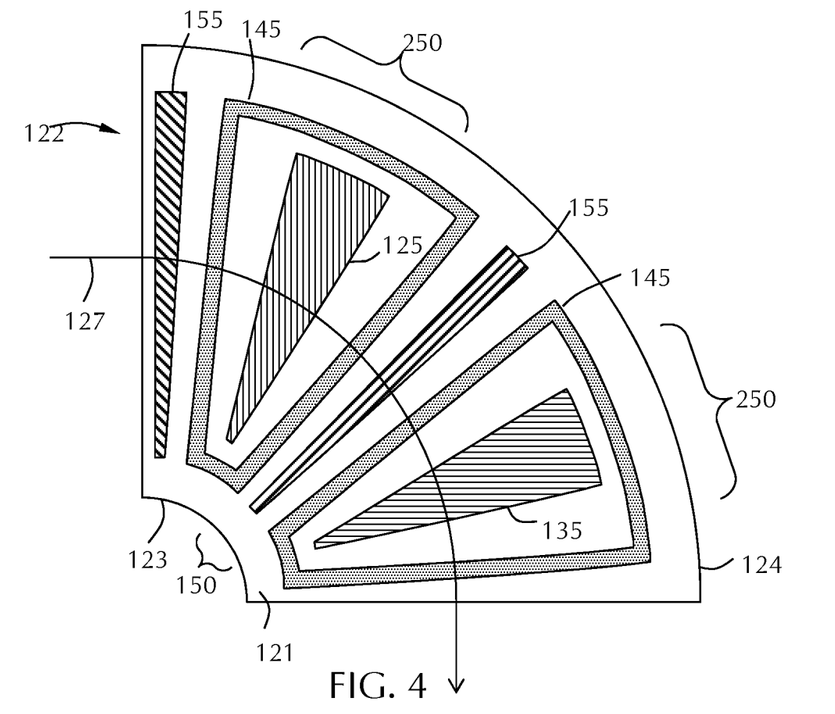
FIG. 4 shows a schematic view of a portion of a wedge shaped gas distribution assembly for use in a batch processing chamber in accordance with one or more embodiment of the disclosure.
Figure 5:
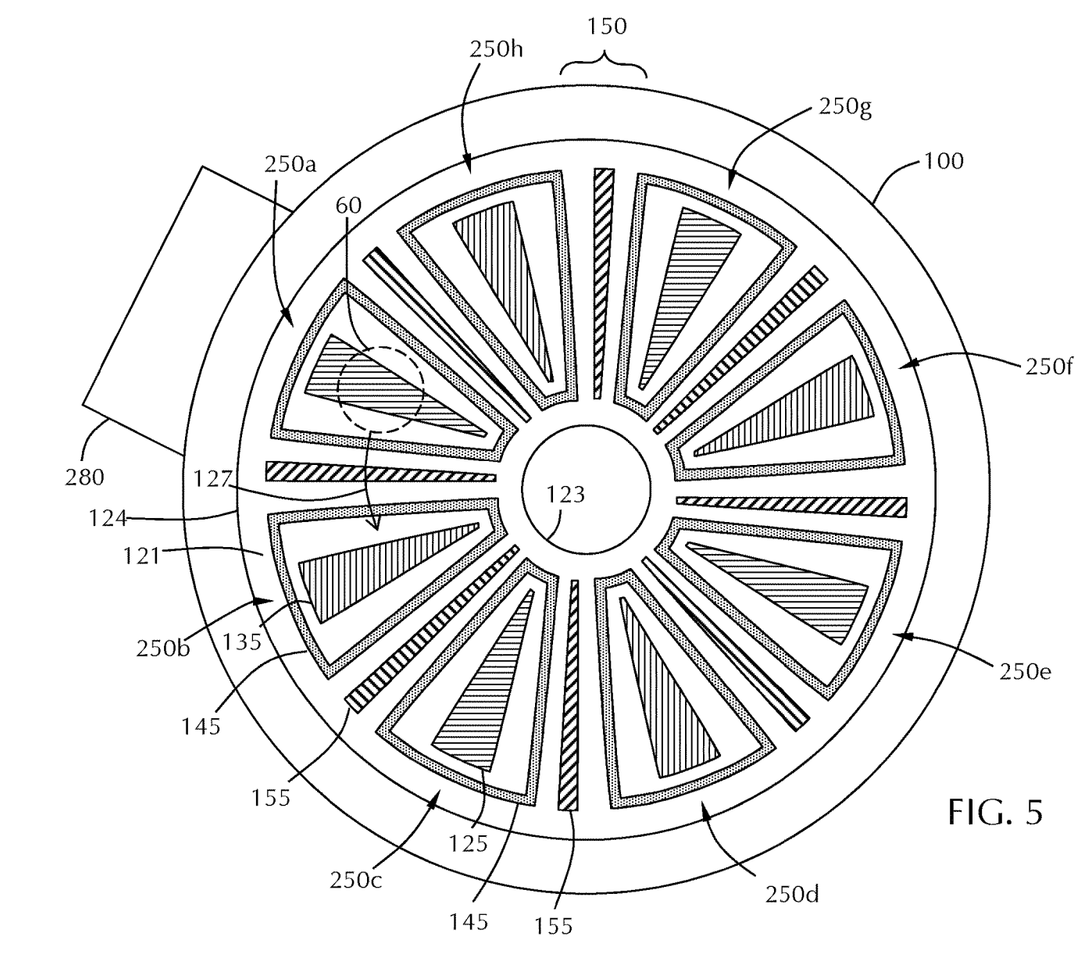
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between.

Embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. In some embodiments, the number of processing regions is greater than the number of gas curtains and one or more of the gases present in the processing regions not separated by a gas curtain are combined.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example, if the first reactive gas is flowing into processing regions 250b through processing region 250h, an inert gas would be flowing into processing region 250a. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150. At least a portion of the substrate surface is exposed to a first process condition in a first section 250a of the processing chamber.

The substrate surface is laterally moved through a gas curtain 150 to a second section 250b of the processing chamber. The substrate surface is exposed to a second process condition in the second section 250b.

The substrate surface is laterally moved through a gas curtain 150 to a third section 250c of the processing chamber. The substrate surface can then be exposed to a third process condition in the third section 250c. In some embodiments, the third section 250c contains the same process condition as one or more of the first section 250a or the second section 250b.

The substrate surface is laterally moved through a gas curtain 150 to a fourth section 250d of the processing chamber. The substrate surface can then be exposed to a fourth process condition in the fourth section 250d. In some embodiments, the fourth section 250d contains the same process condition as one or more of the first section 250a, the second section 250b or the third section 250c.

The fifth section 250e, sixth section 250f, seventh section 250g and/or eighth section 250h can each independently have one or more of the first through fourth process conditions or can have different process conditions. In some embodiments, the first, third, fifth and seventh sections have the same process conditions and the second, fourth, sixth and eighth sections have the same process conditions so that a wafer making one cycle around the processing chamber would be exposed to four repeating exposures of the first process condition and the second process condition. For example, the wafer might be encounter four repeated exposures to an A process and a B process in the first process condition and the second process condition, respectively, to make four AB repetitions.

In some embodiments, the first and fifth sections have a first process condition, the second and sixth sections have a second process condition, the third and seventh sections have a third process condition and the fourth and eighth sections have a fourth process condition. A wafer making a complete cycle around the processing chamber of this configuration would have two repeated exposures to the four sequential process conditions. For example, the wafer might encounter two repeated exposures to an A process, a B process, a C process and a D process in the first process condition, second process condition, third process condition and fourth process condition, respectively, to make two ABCD repetitions.

In some embodiments, at least one of the processing regions is a plasma processing region in which a plasma is generated and at least one of the processing regions is a non-plasma processing region in which there is no plasma generated. The plasma processing region can be a direct plasma processing region in which the susceptor assembly or the substrate acts as an electrode or a remote plasma processing region in which the plasma is generated without the susceptor assembly or the substrate acting as an electrode. The skilled artisan will recognize that a plasma processing region, either direct or remote, will have a suitable power source connected to an RF hot electrode. The power source supplies power of a predetermined frequency to the RF hot electrode. The powered electrode ionizes a gas within the plasma source to form the plasma.

Some embodiments of the disclosure are directed to processing methods comprising moving a substrate between a first processing region without a plasma and a second processing region with a plasma. The first processing region is also referred to as a non-plasma processing region. The second processing region is also referred to as a plasma processing region. The substrate has a breakdown voltage. The skilled artisan will recognize that the substrate refers to any part of the substrate or device (e.g., transistor) being formed on the substrate.

The substrate of some embodiments is larger than the processing region so that not all of the substrate can fit within the processing region at any given time. During movement of the substrate between the plasma processing region and the non-plasma processing region parts of the substrate are exposed to the plasma and parts of the substrate are not exposed to plasma. This non-uniform plasma exposure results in charge buildup or a voltage (potential) differential on the substrate.

In some embodiments, rotation of the substrate around the central axis of the susceptor assembly is sufficient so that any given point on the substrate is within a particular processing region (e.g., the second processing region or plasma processing region) for a time in the range of about 100 milliseconds to about 500 milliseconds. In some embodiments, the rotation speed is sufficient so that any given point on the substrate is exposed to the particular processing region for a time in the range of about 150 milliseconds to about 300 milliseconds, or about 200 milliseconds.

The power to the plasma processing region or the plasma source is pulsed so that power is applied to the RF hot electrode in a non-continuous manner. Pulsing the power of the plasma in the second processing region prevents a voltage differential from being formed on the substrate that exceeds the breakdown voltage of the substrate or device formed (or being formed) on the substrate.

A pulse of power to the plasma source comprises an ON time and an OFF time. The ON time being defined as the time period that power is supplied to the plasma source and the OFF time being defined as the time period that the power is turned off or not supplied to the plasma source. The ratio of the ON time to the OFF time can vary and can affect the average power and charge buildup on the substrate. In some embodiments, the duty cycle of the pulse is in the range of about 30% to about 70%, or in the range of about 35% to about 65%, or in the range of about 40% to about 60%, or in the range of about 45% to about 55%, or about 50%. In some embodiments, the ON:OFF time is in the range of about 3:7 to about 7:3, or in the range of about 3.5:6.5 to about 6.5:3.5, or in the range of about 4:6 to about 6:4, or in the range of about 4.5:5.5 to about 5.5:4.5, or about 1:1.

Each of the ON time and OFF time can vary. In some embodiments, each of the ON time and OFF time are independently selected from the range of about 1 μsec to about 50 μsec. In some embodiments, the time is in the range of about 2 μsec to about 40 μsec, or in the range of about 3 μsec to about 30 μsec, or in the range of about 4 μsec to about 15 μsec, or about 5 μsec.

In some embodiments, the ON time is measured as the amount of time required to accumulate a voltage differential on the substrate less than the breakdown voltage ($V_b$) of the substrate or device on the substrate. In some embodiments, during the ON time, the substrate accumulates a voltage differential less than or equal to about 95% of the breakdown voltage, or less than or equal to about 90% of the breakdown voltage, or less than or equal to about 85% of the breakdown voltage, or less than or equal to about 80% of the breakdown voltage.

In some embodiments, the OFF time is sufficient to allow the voltage differential on the substrate to discharge to less than or equal to about 10% of the breakdown voltage, or to less than or equal to about 5% of the breakdown voltage, or to less than or equal to about 4% of the breakdown voltage, or to less than or equal to about 3% of the breakdown voltage, or to less than or equal to about 2% of the breakdown voltage, or to less than or equal to about 1% of the breakdown voltage.

In some embodiments, the plasma is not extinguished during the OFF time. The inertia of the plasma generated during the ON time is sufficiently large to ensure that the plasma remains ignited during the OFF time of the duty cycle.

As shown in FIG. 1, a controller 395 may be provided and coupled to various components of the processing chamber 100 to control the operation thereof. The controller 195 can be a single controller that controls the entire processing chamber 100, or multiple controllers that control individual portions of the processing chamber 100. In some embodiments, the controller 195 includes a central processing unit (CPU) 196, support circuits 197, memory 198, and an input/output (I/O) 199. The controller 195 may control the processing chamber 100 directly, or via computers (or controllers) associated with particular process chamber and/or support system components. The controller 195 may be one of any form of general-purpose computer processor that can be used in an industrial setting for controlling various chambers and sub-processors. The memory 198 or computer readable medium of the controller 195 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 197 are coupled to the CPU 196 for supporting the processor in a conventional manner. These circuits include cache, power supplies, clock circuits, input/output circuitry and subsystems, and the like. One or more processes may be stored in the memory 198 as software routine that may be executed or invoked to control the operation of the processing chamber 100 or individual processing chambers in the manner described herein. The software routine may also be stored and/or executed by a second CPU (not shown) that is remotely located from the hardware being controlled by the CPU 196. The input/output 199 can include keyboards, computer mice, displays and/or printers.

In some embodiments, a controller is coupled to the susceptor assembly and the gas distribution assembly. The controller has one or more configurations to control the various functions and processes. In some embodiments, the configurations are selected from a first configuration to rotate the susceptor assembly about the central axis, a second configuration to provide a flow of gas into the non-plasma processing region, a third configuration to provide a flow of gas into the plasma processing region, a fourth configuration to provide power to the plasma processing region to ignite a plasma and/or a fifth configuration to pulse the power to the plasma processing region to generate an ON time and an OFF time for the plasma processing region.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    positioning a substrate within a batch processing chamber comprising a plurality of process regions separated by gas curtains, the substrate having a breakdown voltage;
    moving the substrate from a first processing region without a plasma to a second processing region with a plasma; and
    pulsing a power of the plasma in the second processing region to prevent a voltage differential on the substrate from exceeding the breakdown voltage,
    wherein pulsing the power comprises supplying power to the plasma for an ON time and not supplying power for an OFF time, the OFF time being sufficient to allow the voltage differential on the substrate to discharge to less than or equal to 5% of the breakdown voltage and the plasma is not extinguished during the OFF time.

2. The method of claim 1, wherein the processing regions have a size smaller than a size of the substrate.

3. The method of claim 1, wherein the substrate is moved at a speed sufficient so that any given point on the substrate is exposed to the second processing region for a time in the range of 100 millisecond to 500 millisecond.

4. The method of claim 2, wherein the time is 200 milliseconds.

5. The method of claim 1, wherein the ON:OFF time is in the range of 4:6 to about 6:4.

6. The method of claim 1, wherein the ON:OFF time is 1:1.

7. The method of claim 1, wherein the ON time is in the range of 1 µsec to about 50 µsec.

8. The method of claim 1, wherein the OFF time is in the range of 1 µsec to about 50 µsec.

9. The method of claim 1, wherein during the ON time, the substrate accumulates a voltage differential less than or equal to 95% of the breakdown voltage.

10. The method of claim 9, wherein the substrate accumulates a voltage differential less than or equal to 80% of the breakdown voltage.

11. The method of claim 1, wherein the OFF time is sufficient to allow the voltage differential on the substrate to discharge to less than or equal to 1% of the breakdown voltage.

12. The method of claim 1, wherein each of the processing regions is pie-shaped and the substrate is rotated about a central axis of a susceptor assembly.

13. A processing method comprising:
    positioning a substrate on a susceptor assembly within a batch processing chamber comprising a plurality of pie-shaped processing regions arranged in circular shape, each of the pie-shaped processing region separated form an adjacent processing region by a gas curtain, the substrate having a breakdown voltage, the plurality of pie-shaped processing regions including a first processing region with a plasma and a second processing region with a plasma, the second processing region sized so that the entire substrate does not fit within the second processing region at one time;
    rotating the substrate on the susceptor assembly around an axis of the susceptor assembly to move the substrate from the first processing region to the second processing region; and
    pulsing a power of the plasma in the second processing region comprising supplying power to the plasma for an ON time and not providing power to the processing region for an OFF time, the ON time and OFF time configured to prevent a voltage differential on the substrate from exceeding the breakdown voltage and the plasma is not extinguished during the OFF time.

14. The method of claim 13, wherein the substrate is moved at a speed sufficient so that any given point on the substrate is exposed to the second processing region for a time in the range of 100 µsecond to 500 µsecond.

15. The method of claim 13, wherein the ON:OFF time is 1:1.

16. The method of claim 13, wherein during the ON time, the substrate accumulates a voltage differential less than or equal to 95% of the breakdown voltage and during the OFF time, the voltage differential on the substrate to discharge to less than or equal to 1% of the breakdown voltage.

17. A processing chamber comprising:
    a susceptor assembly to support a plurality of substrates and rotate the plurality of substrate about a central axis of the susceptor assembly, the susceptor assembly having a top surface with a plurality of recesses sized to hold the substrates;
    a gas distribution assembly having a front surface spaced from the top surface of the susceptor assembly to form a gap, the gas distribution assembly including a plurality of gas ports and vacuum ports to provide a plurality of gas flows into the gap and a plurality of vacuum flows to remove gases from the gap, the plurality of gas ports and vacuum ports arranged to form a plurality of process regions, each process region separated from adjacent process regions by a gas curtain, at least one of the processing regions being a plasma processing region and at least one of the processing regions being a non-plasma processing region; and a controller coupled to the susceptor assembly and the gas distribution assembly, the controller having a first configuration to rotate the susceptor assembly about the central axis, a second configuration to provide a flow of gas into the non-plasma processing region, a third configuration to provide a flow of gas into the plasma processing region, a fourth configuration to provide power to the plasma processing region to ignite a plasma and a fifth configuration to pulse the power to the plasma processing region to generate an ON time and an OFF time for the plasma processing region, the OFF time being sufficient to allow the voltage differential on the substrate to discharge to less than or equal to 5% of the breakdown voltage and the plasma is not extinguished during the OFF time.

\* \* \* \* \*